(12) United States Patent
Yoshimochi

(10) Patent No.: US 8,125,025 B2
(45) Date of Patent: Feb. 28, 2012

(54) SEMICONDUCTOR DEVICE

(75) Inventor: Kenichi Yoshimochi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 489 days.

(21) Appl. No.: 12/270,173

(22) Filed: Nov. 13, 2008

(65) Prior Publication Data

US 2009/0140329 A1    Jun. 4, 2009

(30) Foreign Application Priority Data

Nov. 14, 2007 (JP) .................. 2007-295950

(51) Int. Cl.
*H01L 29/732* (2006.01)

(52) U.S. Cl. .. 257/330; 257/302; 257/328; 257/E29.165

(58) Field of Classification Search .......... 257/328–333, 257/E21.623, E29.165, 135, 220, 263, 302, 257/397, 520, E29.201, E27.054, E27.056, 257/E27.057, E27.096, E29.118, E29.131, 257/E29.183, E29.189, E29.198, E29.257, 257/E29.313, E29.318, E21.375, E21.41, 257/E21.418, E21.447, E21.612, E21.629, 257/E21.676, E21.693

See application file for complete search history.

(56) References Cited

U.S. PATENT DOCUMENTS

| 5,442,214 | A * | 8/1995 | Yang .............................. 257/328 |
| 6,368,920 | B1 * | 4/2002 | Beasom ........................ 438/270 |
| 7,262,460 | B2 * | 8/2007 | Schmitz et al. ............... 257/330 |
| 2004/0145012 | A1 * | 7/2004 | Shiga et al. ................... 257/330 |
| 2005/0104093 | A1 * | 5/2005 | Yoshimochi .................. 257/224 |
| 2006/0205222 | A1 * | 9/2006 | Zandt et al. ................... 438/700 |

FOREIGN PATENT DOCUMENTS

| JP | 2001-284587 | 10/2001 |
| JP | 2003-324197 | 11/2003 |

* cited by examiner

*Primary Examiner* — Cuong Q Nguyen
*Assistant Examiner* — Yosef Gebreyesus
(74) *Attorney, Agent, or Firm* — Fish & Richardson P.C.

(57) ABSTRACT

A semiconductor device (such as a MOSFET) can prevent a lowering in the reliability of a gate insulating film and can cope with a finer trench pattern. The MOSFET has a plurality of trenches penetrating a $p^-$-type doped region and a gate electrode formed on the interior surface of each trench with a silicon oxide film (gate insulating film) interposed. The gate electrode is embedded inside the trench such that the upper surface of the former is located above the $p^-$-type doped region, and includes a polysilicon layer facing the $p^-$-type doped region with the silicon oxide film sandwiched therebetween and a low-resistance layer formed on the upper surface of the polysilicon layer and having a lower electrical resistivity than that of the polysilicon layer. An SiN film is formed between the silicon oxide film and the side surface of the low-resistance layer above the $p^-$-type doped region.

8 Claims, 11 Drawing Sheets

SEMICONDUCTOR DEVICE

This application is based on Japanese Patent Application No. 2007-295950 filed on Nov. 14, 2007, the contents of which are hereby incorporated by reference.

BACKGROUND OF THE INVENTION

1. Field of the Invention

The present invention relates to a semiconductor device, and in particular to a semiconductor device having a trench structure.

2. Description of Related Art

Conventionally, there are known trench gate type (trench structure) MOSFETs (metal oxide semiconductor field effect transistor) having a gate electrode embedded in a trench formed in a semiconductor layer. For these trench gate type MOSFETs (semiconductor devices), as a material to form the gate electrodes, polysilicon made conductive by being doped with an impurity is generally used.

On the other hand, in these days, by reducing the resistance of a gate electrode, speeding up of the switching operation of a MOSFET is attempted. In the above-described MOSFETs having a gate electrode made of polysilicon, by increasing the amount of impurity with which polysilicon is doped (doping concentration), it is possible to reduce the resistance of the gate electrode. However, there is a limit to the solid solubility of an impurity in polysilicon, and therefore, in order to further reduce the resistance of the gate electrode, it is necessary to form the gate electrode from a metal material with a specific resistance (electrical resistivity) lower than that of polysilicon.

For this reason, conventionally, there are known trench gate type MOSFETs with a gate electrode made of a metal material. Such MOSFETs are, for example, disclosed in Japanese Unexamined Patent Application No. 2001-284587. Japanese Unexamined Patent Application No. 2001-284587 just mentioned discloses a MOSFET (semiconductor device) having a gate electrode, made of tungsten, formed inside a trench.

FIG. 22 is a sectional view showing the conventional MOSFET (semiconductor device) disclosed in Japanese Unexamined Patent Application No. 2001-284587 mentioned above with its structure simplified. With reference to FIG. 22, in the conventional MOSFET (semiconductor device), an epitaxial layer (semiconductor layer) 102 is formed on the upper surface of an n$^+$-type semiconductor substrate 101. In the epitaxial layer 102, in the order from the semiconductor substrate 101 side, there are formed an n$^-$-type doped region (drain region) 102a, a p-type doped region 102b, and an n$^+$-type doped region (source region) 102c.

In the epitaxial layer 102, there is also formed a trench 103 which penetrates through the n$^+$-type doped region (source region) 102c, through the p-type doped region 102b, and halfway through the n.sup.-type doped region (drain region) 102a. At the floor and interior side surfaces of the trench 103, there is formed a gate insulating film 104 made of SiO$_2$. On the gate insulating film 104 inside the trench 103, there is formed, with a SiN film 105 interposed, a gate electrode 106 made of tungsten. The SiN film 105 is formed, with the gate insulating film 104 interposed, on the entire surface inside the trench 103 (on the floor and interior side surfaces of the trench 103). On the upper surface of the epitaxial layer 102, there is formed an UDO (undoped oxide) film 107 which covers the upper and sides surfaces of the gate electrode 106, and on the UDO film 107, there is formed a source electrode 108. On the reverse surface (lower surface) of the semiconductor substrate 101, a drain electrode 109 is formed. Note that the source electrode 108 and the n$^+$-type doped region (source region) 102care electrically connected together via unillustrated contact electrodes.

In the conventional MOSFET structured as described above, by applying a predetermined voltage between the source electrode 108 and the drain electrode 109, and in addition setting the gate electrode 106 to a predetermined potential, a channel region 110 is formed in a region in the vicinity of the interface between the p-type doped region 102b and the gate insulating film 104 (a region in the p-type doped region 102b along the trench 103-side wall). Thus, a current flows between the n$^+$-type doped region (source region) 102c and the n$^-$-type doped region (drain region) 102a. Note that the gate electrode 106 and the SiN film 105 face the channel region 110.

In the conventional MOSFET described above, since the gate electrode 106 made of tungsten is formed with the SiN film 105 interposed, with the SiN film 105, diffusion of metal atoms (tungsten atoms) into the gate insulating film 104 is reduced.

In the conventional MOSFET shown in FIG. 22, however, it is necessary to form the SiN film 105 on the entire surface inside the trench 103, and this leads to a problem of difficulty in forming the SiN film 105. In these days, trench patterns are becoming increasingly fine, and even trenches with depths about 1 μm to 3 μm and width about 0.3 μm to 0.5 μm are formed. In a case where a trench having such a large aspect ratio is formed in the conventional MOSFET described above, formation of the SiN film 105 is extremely difficult. This may lead to a problem that part of the inside of the trench 103 remains uncovered with the SiN film 105, and in this case, via this part, metal atoms of the gate electrode 106 may inconveniently diffuse into the gate insulating film 104. Thus, the reliability of the gate insulating film 104 is lowered.

It is also difficult to embed, with a satisfactory result, tungsten (a metallic material, namely the gate electrode 106) inside the trench having a large aspect ratio. With the conventional MOSFET shown in FIG. 22, it is therefore difficult to cope with a finer trench pattern.

Furthermore, in the conventional structure shown in FIG. 22, because the gate electrode 106 is made of tungsten, compared with a case where the gate electrode is made of polysilicon, the driving voltage of the MOSFET inconveniently varies greatly.

Here, the driving voltage of a MOSFET is given by Threshold value $$V_T = V_{FB} + 2\psi_B + (2\varepsilon_S q N_A (2\psi_B))^{1/2} / C_O$$
$$= (\varphi - Q_f / C_O) + 2\psi_B + (4\varepsilon_S q N_A \psi_B)^{1/2} / C_O$$

where $V_{FB}$ is the flat band voltage, $\phi_B$ is the internal electrostatic potential of the semiconductor (p-type doped region 102b), $\varepsilon_s$ is the dielectric constant of the semiconductor (p-type doped region 102b), q is the amount of electric charge of an electron, $N_A$ is the concentration of the acceptor impurity, $C_O$ is the capacity per unit area of the gate insulating film 104, $\phi$ is the difference in work function (the difference between the work functions of the gate electrode 106 and the semiconductor (p-type doped region 102b) facing each other with the gate insulating film 104 lying in between), and $Q_f$ is the fixed charge within the gate insulating film 104.

In a case where the gate electrode 106 is made of tungsten, compared with a case where the gate electrode is made of polysilicon, since the difference in work function φ greatly varies, according to the above-described formula, in the conventional MOSFET shown in FIG. 22, compared with common MOSFETs where the gate electrode is made of polysilicon, the threshold value $V_T$ greatly varies. Thus, inconveniently, as described above, the driving voltage varies greatly.

In the conventional structure described above, because the gate electrode 106 made of tungsten is formed so as to face the channel region 110 with the gate insulating film 104 and the SiN film 105 interposed, due to the thickness of the SiN film 105, the difference in dielectric constant between the gate insulating film 104 and the SiN film 105, and for other causes, the device characteristics such as the driving voltage may inconveniently vary.

As described above, with the conventional MOSFET shown in FIG. 22, although it is possible to reduce the resistance of the gate electrode 106, the device characteristics such as the driving voltage may inconveniently vary greatly. To avoid variations in the device characteristics such as the driving voltage, a major design change is required in the MOSFET. That is, with the conventional MOSFET shown in FIG. 22, it is difficult to speed up the switching operation, while reducing variations in the device characteristics such as the driving voltage.

SUMMARY OF THE INVENTION

The present invention has been devised to solve the above problems, and it is an object of the invention to provide a semiconductor device that can prevent a lowering in the reliability of a gate insulating film and can cope with a finer trench pattern.

Another object of the invention is to provide a semiconductor device that can easily reduce variations in the device characteristics such as the driving voltage, and simultaneously speed up the switching operation.

To achieve the above objects, a semiconductor device according to a first aspect of the invention has a semiconductor layer including a semiconductor region of one conductivity type, a trench formed in the semiconductor layer so as to penetrate through the semiconductor region, the trench having an open end thereof located at a top surface side of the semiconductor layer, a channel region formed in the semiconductor region so as to lie along a side wall of the trench, and a gate electrode formed on an interior surface of the trench with a gate insulating layer interposed. The gate electrode is embedded inside the trench such that the upper surface of the former is located above the semiconductor region, and the gate electrode includes a polysilicon layer facing the channel region with the gate insulating layer interposed and a low-resistance layer formed on the upper surface of the polysilicon layer and having an electric resistivity lower than that of the polysilicon layer. A protecting film is formed between the gate insulating layer and the gate electrode above the semiconductor region. Note that a semiconductor layer according to the invention includes a semiconductor substrate.

In the semiconductor device according to the first aspect, as described above, by forming the gate electrode so as to include the polysilicon layer and the low-resistance layer, and embedding the polysilicon layer inside the trench such that the upper surface of the former is located above the semiconductor region and forming the polysilicon layer so as to face the channel region with the gate insulating film interposed, the difference in work function φ can be set substantially equal to that in a case where the gate electrode is formed only out of a polysilicon layer. Accordingly, the threshold value $V_T$ can also be made substantially equal to that in a case where the gate electrode is formed only out of a polysilicon layer; it is thus possible to prevent the driving voltage from varying greatly. Furthermore, by forming the low-resistance layer, having an electrical resistivity lower than that of the polysilicon layer, on the upper surface of the polysilicon layer, the overall resistance of the gate electrode can be reduced; it is thus possible to easily prevent the driving voltage from varying greatly, and simultaneously to speed up the switching operation.

In the semiconductor device according to the first aspect, as described above, by forming the protecting film between the gate insulating film and the gate electrode above the semiconductor region, even though the low-resistance layer is formed on the upper surface of the polysilicon layer, diffusion of constituent atoms of the low-resistance layer into the gate insulating film can be reduced with this protecting film; it is thus possible to prevent the inconvenience of a lowering in the reliability of the gate insulating film owing to the diffusion of constituent atoms of the low-resistance layer into the gate insulating layer. Moreover, by forming the protecting film between the gate insulating film and the gate electrode above the semiconductor region, the aspect ratio can be decreased; it is thus possible to easily form the protecting film inside the trench, as distinct from in a case where a protecting film is formed on the entire surface inside the trench. Thus, even with a finer trench pattern, a satisfactory protecting film can be formed, and thus it is possible to cope with a finer trench pattern.

In the structure described above, the protecting film is not formed in a part facing the channel region; it is thus possible to reduce the influence of the protecting film on the device characteristics such as the driving voltage. Furthermore, the protecting film is not formed between the polysilicon layer and the low-resistance layer either; it is thus possible to form the low-resistance layer on the upper surface of the polysilicon layer in a state electrically connected to the polysilicon layer.

In the semiconductor device according to the first aspect, preferably, the protecting film is formed so as to cover the side surface of the low-resistance layer. With this structure, diffusion of constituent atoms of the low-resistance layer into the gate insulating film can be effectively reduced; it is thus possible to effectively prevent a lowering in the reliability of the gate insulating film.

In the semiconductor device according to the first aspect, preferably, the protecting film is made out of a SiN film. With this structure, diffusion of constituent atoms of the low-resistance layer into the gate insulating film can easily be reduced; it is thus possible to easily prevent a lowering in the reliability of the gate insulating film.

In the semiconductor device according to the first aspect, preferably, the low-resistance layer is made out of a metal layer. With this structure, the resistance of the gate electrode can easily be reduced, and thus the switching operation can easily be speeded up.

In this case, preferably, the low-resistance layer contains at least one element selected from the group of Al, Cu, W, Ti, Mo, Co, Ag, Pt, and Pb. With this structure, the resistance of the gate electrode can be reduced more easily, and thus the switching operation can be speeded up more easily.

In the above-described structure having a low-resistance layer made out of a metal layer, the low-resistance layer may contain a metal silicide.

In the above-described structure having a low-resistance layer made out of a metal layer, preferably, a barrier metal layer, interposed between the polysilicon layer and the low-resistance layer so as to reduce diffusion of metal atoms of the low-resistance layer into the polysilicon layer, is further included. With this structure, the diffusion of metal atoms of the low-resistance layer into the polysilicon layer can be reduced with the barrier metal layer; it is thus possible to prevent the threshold value from varying owing to the diffusion of metal atoms of the low-resistance layer into the polysilicon layer.

The above-described barrier metal layer may be made of, for example, a metal oxide such as titanium nitride (TiN), tungsten nitride ($WN_x$), etc. Moreover, the barrier metal layer may be made of a metal material such as titanium (Ti).

In the semiconductor device according to the first aspect, preferably, an insulating layer, formed on the upper surface of the low-resistance layer with its upper surface located inside the trench, is further included. With this structure, it is possible to make the interval between adjacent trenches smaller, and thus to easily cope with a finer trench pattern.

As described above, according to the present invention, it is possible to easily obtain a semiconductor device that can prevent a lowering in the reliability of a gate insulating film and can cope with a finer trench pattern.

Furthermore, according to the present invention, it is possible to easily obtain a semiconductor device that can easily reduce variations in the device characteristics such as the driving voltage, and can simultaneously speed up the switching operation.

DETAILED DESCRIPTION OF PREFERRED EMBODIMENTS

Embodiments of the present invention will be described below in detail with reference to the accompanying drawings. In the embodiments below, a description will be given of examples in which the present invention is applied to a MOSFET (field effect transistor) as one example of a semiconductor device.

First Embodiment

Figure 1:
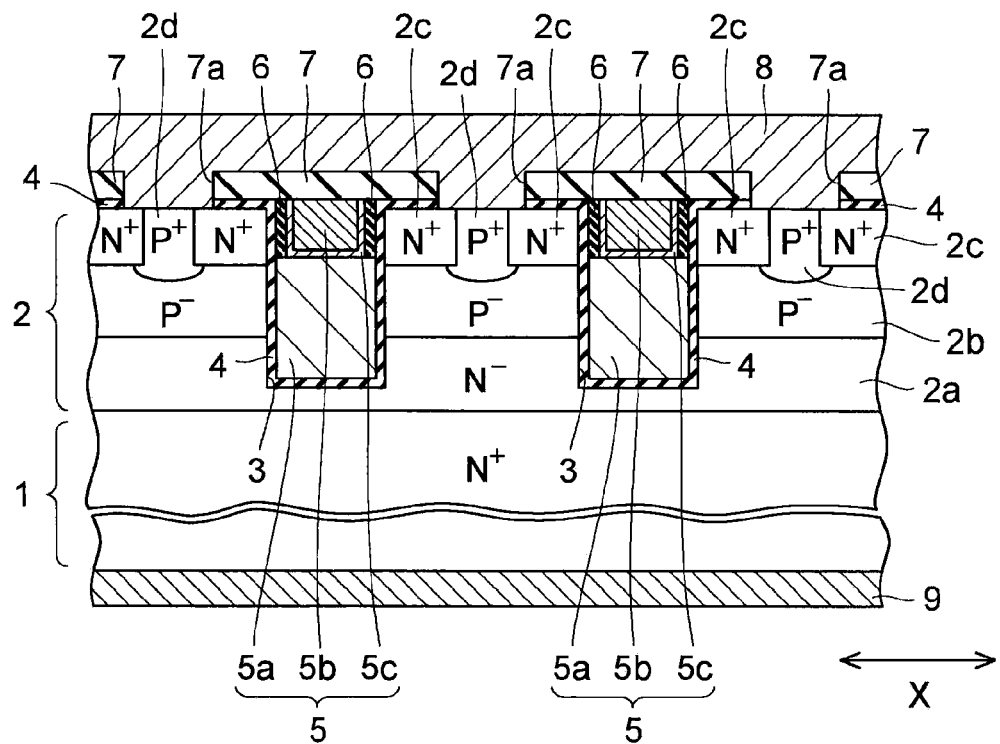
FIG. 1 is a sectional view showing the structure of a MOSFET according to a first embodiment of the present invention.
Figure 2:
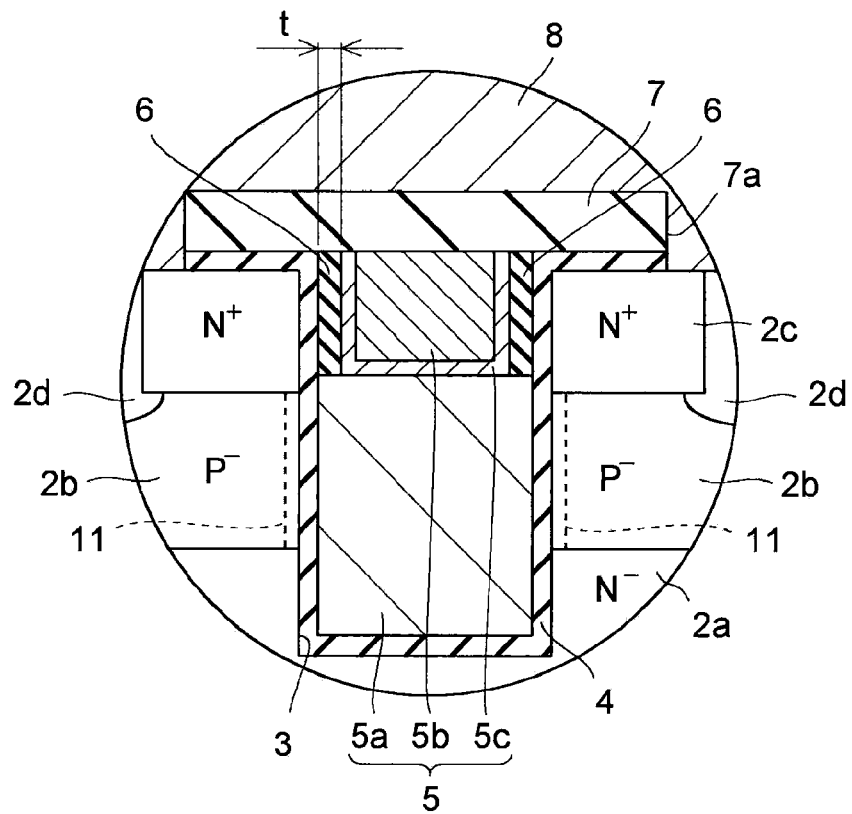
FIG. 2 is an enlarged sectional view showing part of a MOSFET according to the first embodiment.
Figure 3:
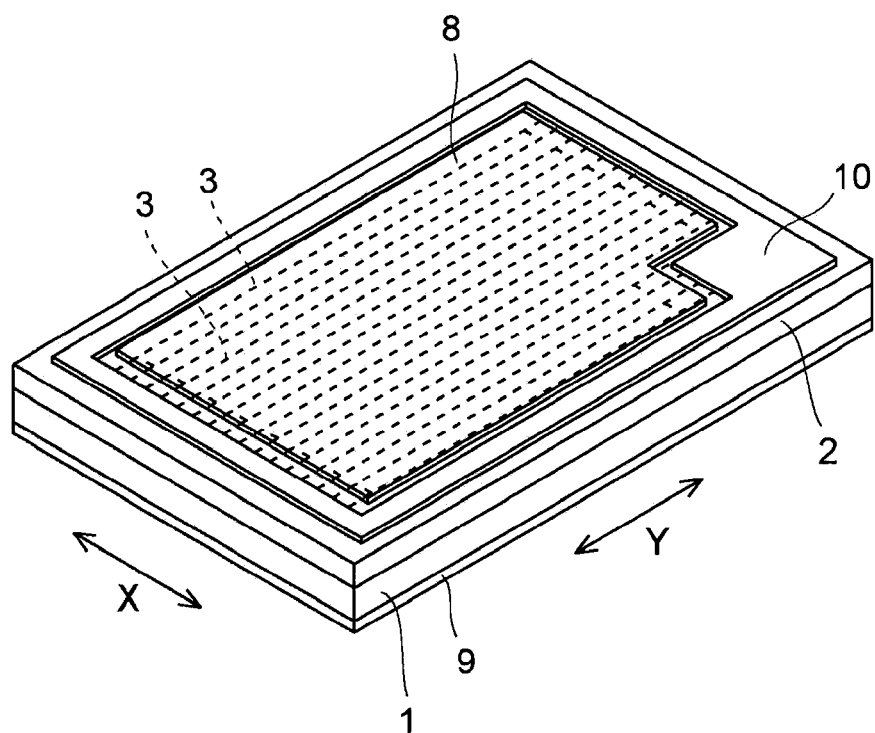
FIG. 3 is an overall perspective view of a MOSFET according to the first embodiment.

FIG. 1 is a sectional view showing the structure of a MOSFET according to a first embodiment of the invention. FIG. 2 is an enlarged sectional view showing part of the MOSFET according to the first embodiment. FIG. 3 is an overall perspective view of the MOSFET according to the first embodiment. First, with reference to FIGS. 1 to 3, a description will be given of the structure of the MOSFET according to the first embodiment of the invention.

In the MOSFET according to the first embodiment, as shown in FIG. 1, on the upper surface of an $n^+$-type silicon substrate 1, there is formed an epitaxial layer 2 made of silicon with a predetermined thickness. In this epitaxial layer 2, there are formed, in the order from the $n^+$-type silicon substrate 1 side, an $n^-$-type doped region 2a, a $p^-$-type doped region 2b, and an $n^+$-type source region 2c. There are also formed a plurality of trenches 3 so as to penetrate the $n^+$-type source region 2c and the $p^-$-type doped region 2b. The trenches 3 are formed by predetermined regions of the epitaxial layer 2 being etched from its upper surface (main surface). That is, the open end of each of the plurality of trenches 3 is on the upper surface side of the epitaxial layer 2. Moreover, the plurality of trenches 3 are formed in elongate (in the shape of stripes) so as to extend in a predetermined direction (the Y direction in FIG. 3) parallel to the upper surface of the epitaxial layer 2. Note that the epitaxial layer 2 is one example of a "semiconductor layer" according to the invention, and the p⁻-type doped region 2b is one example of a "semiconductor region of one conductivity type".

Moreover, the plurality of trenches 3 are arranged at predetermined intervals in a direction (the X direction) parallel to the upper surface of the epitaxial layer 2 and perpendicular to the direction (the Y direction in FIG. 3) in which the trenches 3 extend. The depth of each of the plurality of trenches is set to be smaller than the thickness of the epitaxial layer 2. Specifically, the depth of each of the plurality of trenches 3 is set at about 1 μm to about 3 μm. The width of each of the plurality of trenches 3 in the X direction is set at about 0.3 μm to about 0.5 μm.

The above-described n⁺-type source region 2c is, as a result of the plurality of trenches 3 each being formed so as to penetrate the n⁺-type source region 2c, formed in a rim part of each of the plurality of trenches 3. Between the n⁺-type source regions 2c formed in the rim part of two adjacent trenches 3, there is formed a p⁺-type base region 2d which penetrates the n⁺-type source regions 2c and makes contact with the p⁻-type doped region 2b.

On the interior surface of each of the plurality of trenches 3, there is formed a silicon oxide film 4 made of $SiO_2$ obtained through heat treatment of silicon forming the epitaxial layer 2. The silicon oxide film 4 is extended to and on the upper surface of the n⁺-type source regions 2c. Inside each of the plurality of trenches 3, there is formed a gate electrode 5 with the silicon oxide film 4 interposed.

Here, in the first embodiment, as shown in FIGS. 1 and 2, the above-described gate electrode 5 is formed so as to include a polysilicon layer 5a disposed in a floor part inside the trench 3, a low-resistance layer 5b formed on the upper surface of the polysilicon layer 5, and a barrier metal layer 5c formed between the polysilicon layer 5a and the low-resistance layer 5b. The polysilicon layer 5a is embedded inside the trench 3 such that the upper surface of the former is located above the p⁻-type doped region 2b, and that it faces the p⁻-type doped region 2b with the silicon oxide film 4 interposed. Note that the polysilicon layer 5a is made conductive by being doped with an impurity.

In the first embodiment, the low-resistance layer 5b is made out of a material with a lower electrical resisitivity (specific resistance) than that of the above-described polysilicon layer 5a. Specifically, the low-resistance layer 5b is formed, for example, of aluminum (Al), copper (Cu), tungsten (W), titanium (Ti), nickel (Ni), molybdenum (Mo), cobalt (Co), silver (Ag), platinum (Pt), lead (Pb), or an alloy of any of these, or a metal silicide (silicide). The barrier metal layer sc is made of a conductive material capable of reducing diffusion of metal atoms of the low-resistance layer 5b into the polysilicon layer 5a. Specifically, the barrier metal layer 5c is made, for example, of a metallic material such as titanium (Ti), or a metal nitride such as titanium nitride (TiN), tungsten nitride ($WN_x$), etc.

As described above, since the low-resistance layer 5b is formed on the polysilicon layer 5a with the barrier metal layer 5c interposed, no part of the low-resistance layer 5b and the barrier metal layer 5c faces the p⁻-type doped region 2b with the silicon oxide film 4 interposed. That is, inside the trench 3, only the polysilicon layer 5a out of the gate electrode 5 faces the p⁻-type doped region 2b.

In the first embodiment, as shown in FIG. 2, between the side surface of the low-resistance layer 5b and the silicon oxide film 4, there is formed a SiN film 6 with a thickness t of about 10 nm to about 100 nm. The SiN film 6 is formed, on the upper surface of the polysilicon layer 5a, so as to cover the side surface of the low-resistance layer 5b (to lie along the side surface of the low-resistance layer 5b) with the barrier metal layer 5c interposed. The SiN film 6, because it is formed on the upper surface of the polysilicon layer 5a, is thus disposed above the p⁻-type doped region 2b. That is, SiN film 6 is formed so as not to face the p⁻-type doped region 2b. Note that the SiN film 6 is one example of a "protecting film" according to the present invention.

As shown in FIGS. 1 and 2, on the upper surface of the gate electrode 5, and on the upper surface of the epitaxial layer 2, an interlayer insulating film 7 made of $SiO_2$ is formed. In predetermined regions of the interlayer insulating film 7, there are formed contact holes 7a which expose parts of the n⁺-type source region 2c and the p⁺-type base region 2d.

On the upper surface of the epitaxial layer 2, as shown in FIGS. 1 and 3, so as to cover the interlayer insulating film 7 and to fill the contact holes 7a, there is formed a source electrode 8 made of Al, or an alloy of Al and Si. The source electrode 8 is held in ohmic contact with the n⁺-type source region 2c and the p⁺-type base region 2d, and is electrically insulated from the gate electrode 5 with the interlayer insulating film 7.

On the other hand, on the reverse surface of the n⁺-type silicon substrate 1 (the surface thereof facing away from the epitaxial layer 2), there is formed a drain electrode 9 made out of a multilayer structure which includes Au, Ti, Ni, Ag, etc. The drain electrode 9 is held in ohmic contact with the n⁺-type silicon substrate 1. As shown in FIG. 3, in a predetermined region on the upper surface of the epitaxial layer 2, there is formed a pad electrode 10 electrically connected with the gate electrode 5.

In the MOSFETs according to the first embodiment structured as described above, by applying a predetermined voltage between the source electrode 8 and the drain electrode 9, and in addition setting the gate electrode 5 to a predetermined potential, in the p⁻-type doped region 2b, a channel (channel region) 11 is formed in the vicinity of the interface with the silicon oxide film 4. Thus, via the so formed channel 11, a current can flow between the source electrode 8 and the drain electrode 9. Note that part of the silicon oxide film 4 in and in the vicinity of which it is sandwiched between the p⁻-type doped region 2b and the gate electrode 5 (polysilicon layer 5a) functions as a gate insulating film.

In the first embodiment, as described above, by forming the gate electrode 5 so as to include the polysilicon layer 5a and the low-resistance layer 5b, embedding the polysilicon layer 5a inside the trench 3 such that the upper surface of the former is located above the p⁻-type doped region 2b, and forming the polysilicon layer 5a so as to face the p⁻-type doped region 2b (channel 11) with the silicon oxide film 4 interposed, it is possible to make the difference in work function φ substantially equal to that in a case where the gate electrode is formed only of a polysilicon layer. Accordingly, the threshold value $V_T$ can also be made substantially equal to that in the case where the gate electrode is formed only of a polysilicon layer, and thus it is possible to prevent the driving voltage from varying greatly. That is, with the structure described above, the MOSFET according to the first embodiment can be operated with a driving voltage substantially equal to that of a conventional MOSFET with a gate electrode made of polysilicon.

In the first embodiment, by forming the low-resistance layer 5b, having an electrical resistivity lower than that of the polysilicon layer 5a, on the upper surface of the polysilicon layer 5a, it is possible to reduce the overall resistance of the gate electrode 5. Even in a case where, owing to a finer trench pattern, the gate electrode 5 is formed with a large length in the thickness direction of the epitaxial layer 2, and with a small width in the X direction, the gate electrode 5 can have an adequately low resistance. Thus, it is possible to easily prevent the driving voltage from varying greatly and realize speeding up of the switching operation. With the MOSFET according to the above-described first embodiment, it is possible to reduce switching loss, and thus to reduce power consumption. Thus, by employing the MOSFET in, for example, a DC-DC converter circuit or a switching circuit, it is possible to increase the performance of these circuits.

In the first embodiment, by forming the SiN film 6 between the silicon oxide film 4 and the low-resistance layer 5b above the p$^-$-type doped region 2b (channel 11), so as to cover the side surface of the low-resistance layer 5b (to lie along the side surface of the low-resistance layer 5b) with the barrier metal layer 5c interposed, even though the low-resistance layer 5b is formed on the upper surface of the polysilicon layer 5a, it is possible to reduce diffusion of metal atoms of the low-resistance layer 5b into the silicon oxide film 4. Thus, it is possible to prevent the reliability of the silicon oxide film (gate insulating film) 4 from lowering owing to the diffusion of metal atoms of the low-resistance layer 5b into the silicon oxide film 4.

In the first embodiment, by forming the SiN film 6 between the silicon oxide film 4 and the side surface of the low-resistance layer 5b (barrier metal layer 5c) above the p$^-$-type doped region 2b (channel 11), it is possible to reduce the aspect ratio, and thus, as distinct from in a case where SiN film 6 is formed on the entire surface inside the trench 3, it is possible to easily form the SiN film 6 inside the trench 3. Thus, even with a finer trench pattern, a satisfactory SiN film 6 can easily be formed, and thus, it is possible to easily cope with a finer trench pattern.

In the structure of the above-described first embodiment, since the SiN film 6 is not formed in a part facing the p$^-$-type doped region 2b (channel 11), the influence of the SiN film 6 on device characteristics such as the driving voltage etc. can be reduced. Moreover, since the SiN film 6 is not formed between the polysilicon layer 5a and the low-resistance layer 5b (barrier metal layer 5c) either, the low-resistance layer 5b can be formed on the upper surface of the polysilicon layer 5a in a state electrically connected with the polysilicon layer 5a.

With the first embodiment, by disposing the barrier metal layer 5c between the polysilicon layer 5a and the low-resistance layer 5b, with the barrier metal layer 5c, it is possible to reduce diffusion of metal atoms which form the low-resistance layer 5b into the polysilicon layer 5a. Thus, it is possible to reduce variations in the threshold value $V_T$ owing to metal atoms diffusing into the polysilicon layer 5a.

FIGS. 4 to 16 are sectional views illustrating a method of manufacturing the MOSFET according to the first embodiment of the invention. A description will now be given of the method of manufacturing the MOSFET according to the first embodiment of the invention with reference to FIG. 1 and FIGS. 3 to 16.

Figure 4:
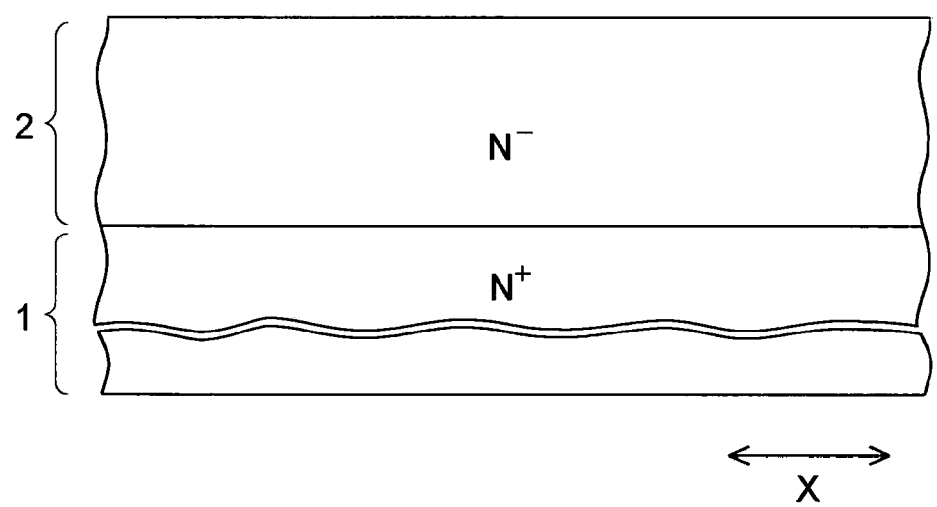
FIG. 4 is a sectional view illustrating a method of manufacturing a MOSFET according to the first embodiment of the invention.
Figure 5:
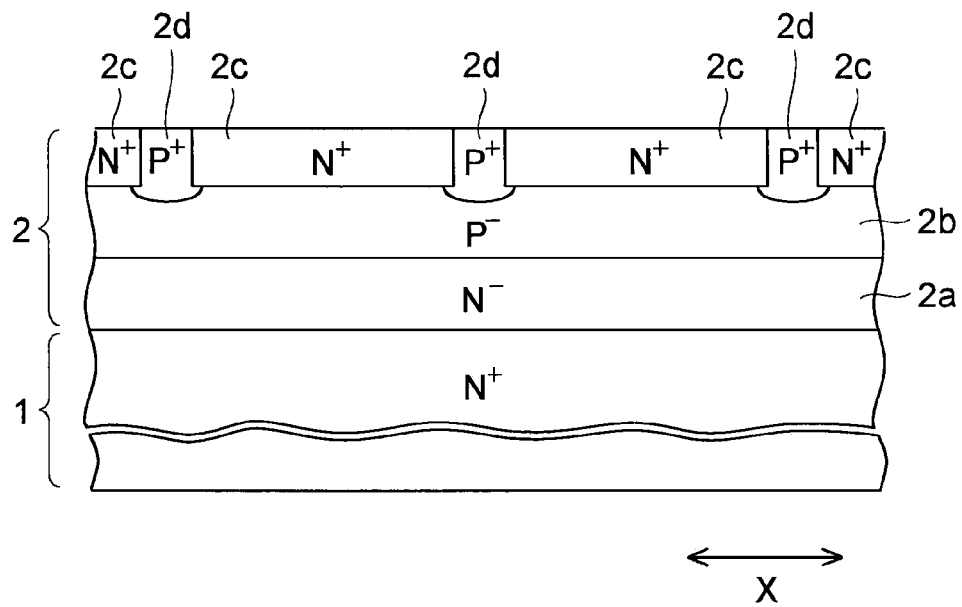
FIG. 5 is a sectional view illustrating a method of manufacturing a MOSFET according to the first embodiment of the invention.

First, as shown in FIG. 4, by epitaxial growth, an n$^-$-type epitaxial layer 2 having a predetermined thickness is formed on the upper surface of the n$^+$-type silicon substrate 1. Next, as shown in FIG. 5, from the surface of the epitaxial layer 2, an impurity for p-type doping is introduced and diffused to turn an upper part of the n$^-$-type epitaxial layer 2 into a p$^-$-type doped region 2b. Subsequently, through a mask of a resist film (unillustrated) having openings at predetermined positions, impurities for p-type and n-type doping are introduced to turn an upper part of the p$^-$-type doped region 2b into a p$^+$-type base region 2d and an n$^+$-type source region 2c, respectively. In this way, in the epitaxial layer 2, there are formed, in the order from the n$^+$-type silicon substrate 1 side, the n$^-$-type doped region 2a, the p$^-$-type doped region 2b, and the n$^+$-type source region 2c, and also the p$^+$-type base region 2d which penetrates the n$^+$-type source region 2c and makes contact with the p$^-$-type doped region 2b.

Figure 6:
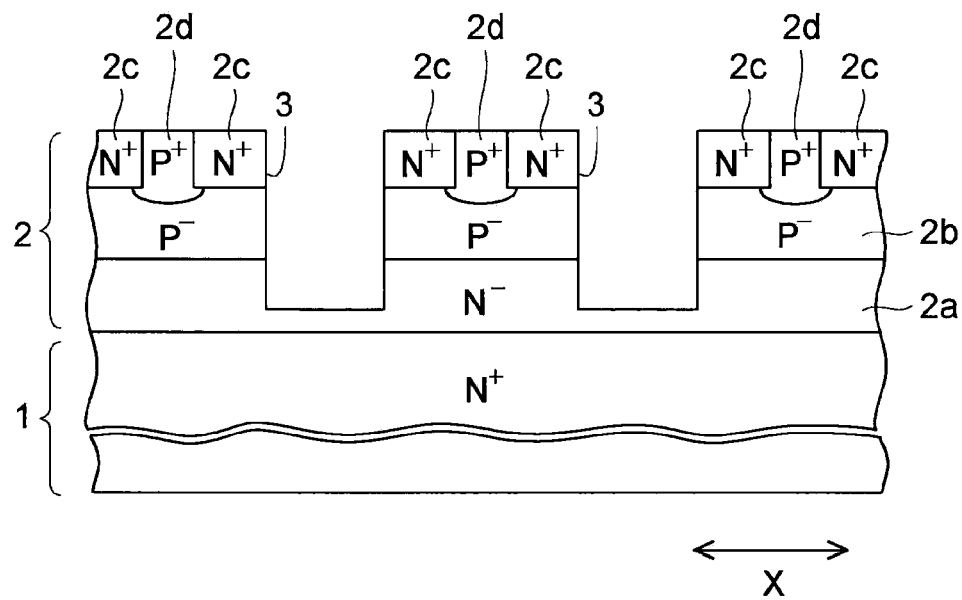
FIG. 6 is a sectional view illustrating a method of manufacturing a MOSFET according to the first embodiment of the invention.
Figure 7:
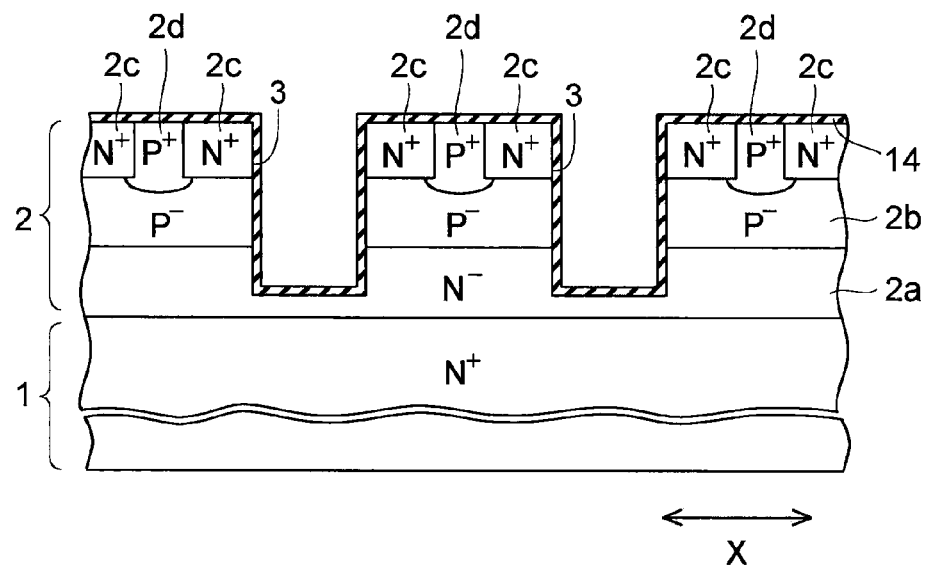
FIG. 7 is a sectional view illustrating a method of manufacturing a MOSFET according to the first embodiment of the invention.

Next, as shown in FIG. 6, by photolithography and etching, a plurality of trenches 3 are formed in the epitaxial layer 2. Specifically, on the upper surface of the epitaxial layer 2, a resist film (unillustrated) which has openings at predetermined positions is formed, and through the resist film as a mask, the epitaxial layer 2 is etched from the top surface thereof to form a plurality of trenches 3 in the epitaxial layer 2. Here, the plurality of trenches 3 are each formed with a width in the X direction of about 0.3 μm to about 0.5 μm, and are each formed elongate (in the shape of a stripe) so as to extend in a predetermined direction (the Y direction in FIG. 3). The plurality of trenches 3 are each formed to be about 1 μm to about 3 μm in depth so as to penetrate through the n$^+$-type source region 2c, through the p$^-$-type doped region 2b, and halfway through the n$^-$-type doped region 2a in the thickness direction of the epitaxial layer 2, Then, by treating the n$^+$-type silicon substrate 1 with thermal oxidation, a surface oxide layer is grown. In this way, as shown in FIG. 7, a silicon oxide film 14 made of SiO$_2$ is formed so as to cover the surface of the epitaxial layer 2 and the interior surface (floor and side surfaces) of the trench 3.

Figure 8:
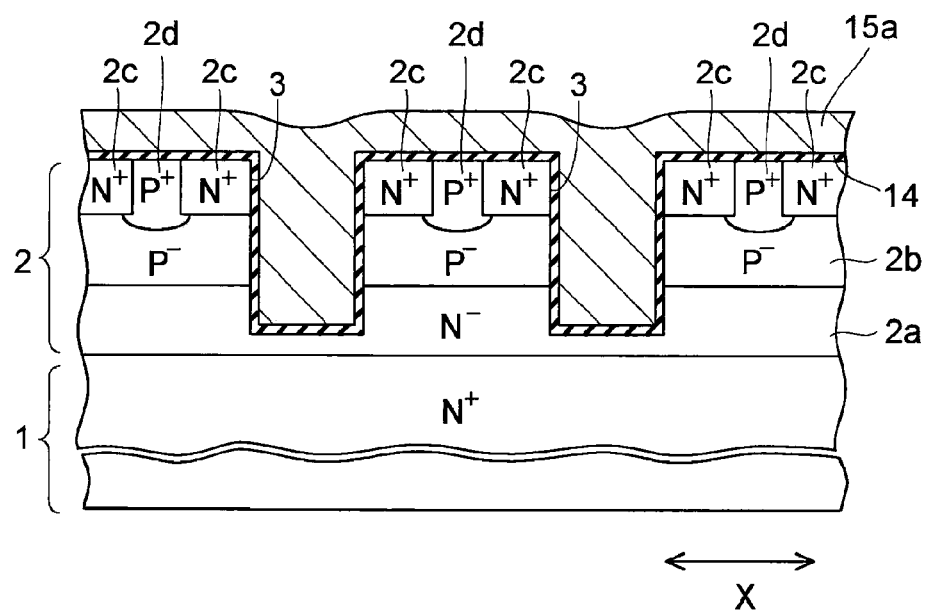
FIG. 8 is a sectional view illustrating a method of manufacturing a MOSFET according to the first embodiment of the invention.

Subsequently, as shown in FIG. 8, a polysilicon layer 15a is formed on the entire top surface of the epitaxial layer 2 having the silicon oxide film 14 formed thereon. The formation of the polysilicon layer 15a can be carried out, for example, by LPCVD (low pressure chemical vapor deposition). By LPCVD just mentioned, even in a case where the aspect ratio of the trench 3 is large, it is possible to embed the polysilicon layer 15a inside the trench 3 with a satisfactory result (tightly).

Figure 9:
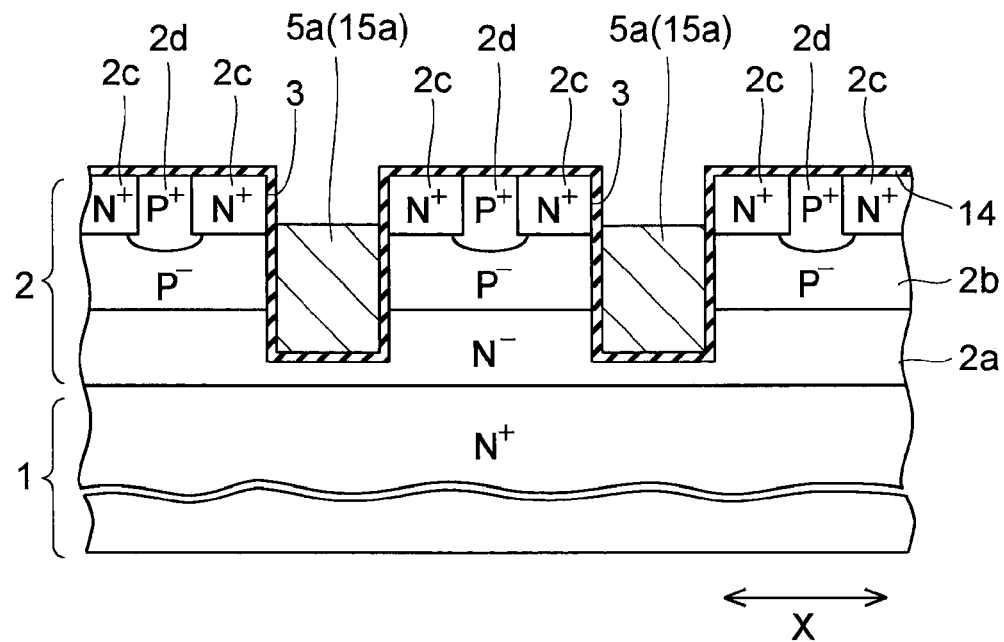
FIG. 9 is a sectional view illustrating a method of manufacturing a MOSFET according to the first embodiment of the invention.

Next, as shown in FIG. 9, by etching back, a predetermined region of the polysilicon layer 15a is removed. In this way, the top surface (etched-back surface) of the polysilicon layer 15a (5a) inside each of the trenches 3 is formed below the top surface of the epitaxial layer 2, and inside the trench 3, there is formed a polysilicon layer 5a which forms the gate electrode 5. Here, the etched-back thickness is controlled such that the upper surface (etched-back surface) of the polysilicon layer 5a is located above the p$^-$-type doped region 2b. Note that, in the above step, the polysilicon layer 5a is formed so as to face the p$^-$-type doped region 2b with the silicon oxide film 14 interposed.

Figure 10:
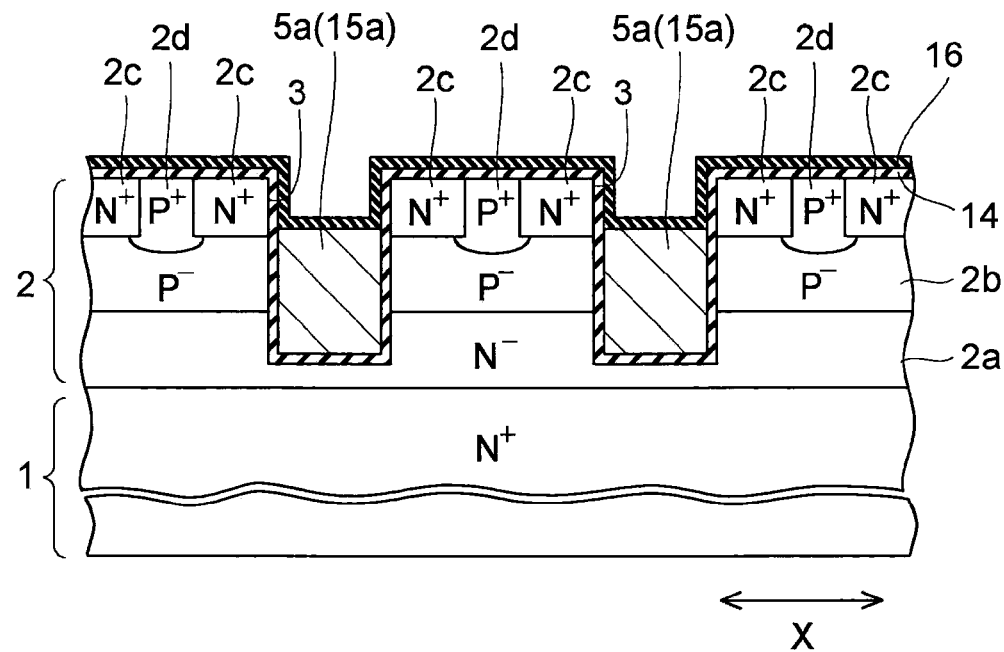
FIG. 10 is a sectional view illustrating a method of manufacturing a MOSFET according to the first embodiment of the invention.

Next, as shown in FIG. 10, a SiN film 16 with a thickness about 10 nm to about 100 nm is formed on the entire surface so as to cover the exposed surface of the silicon oxide film 14 and the polysilicon layer 5a. Here, since, in a floor part inside the trench 3, the polysilicon layer 5a described above is embedded, the aspect ratio of the trench 3 (the aspect ratio of the hollow part inside the trench 3) is thus small. Thus, formation of the SiN film 16 can be carried out with a satisfactory result by plasma CVD or the like. Note that in a case where the aspect ratio of the trench 3 is large, low pressure CVD or the like is required; however, a low pressure CVD device to carry out low pressure CVD is more expensive compared with a plasma CVD device to carry out plasma CVD; therefore, in a case where the SiN film 16 is formed by low pressure CVD, the cost of manufacturing a MOSFET inconveniently rises. On the other hand, with the MOSFET according to the first embodiment, it is possible to form the SiN film 16 using an inexpensive device (a plasma CVD device), and thus to prevent such inconveniences as described above. Moreover, whereas low pressure CVD involves heat treatment carried out at 800° C. or more, whereas plasma CVD involves heat treatment carried out at a relatively low temperature of approximately at 380° C. to 400° C., and thus can reduce the influence on a diffusion layer (doped region).

Figure 11:
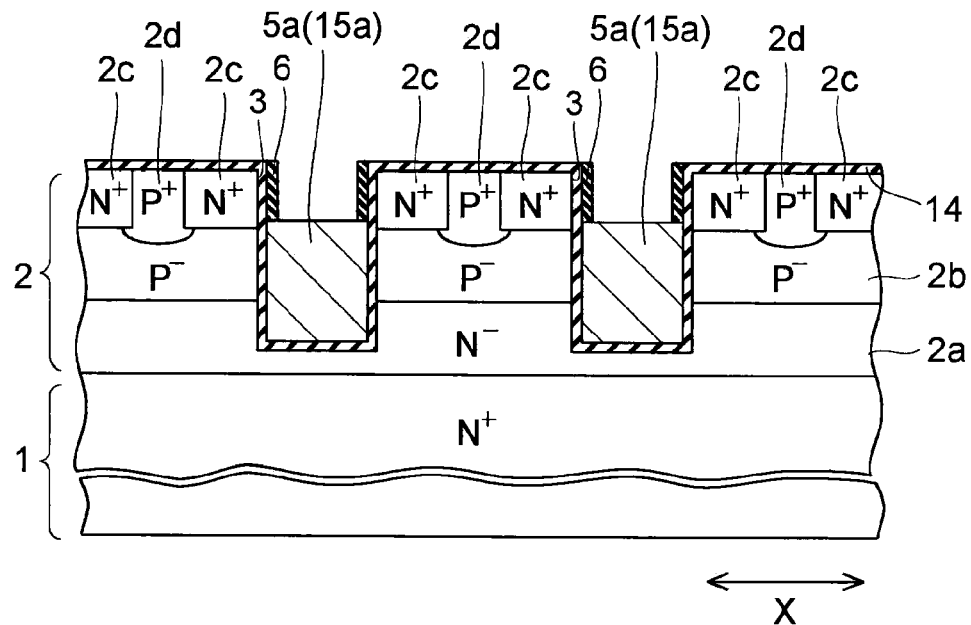
FIG. 11 is a sectional view illustrating a method of manufacturing a MOSFET according to the first embodiment of the invention.
Figure 12:
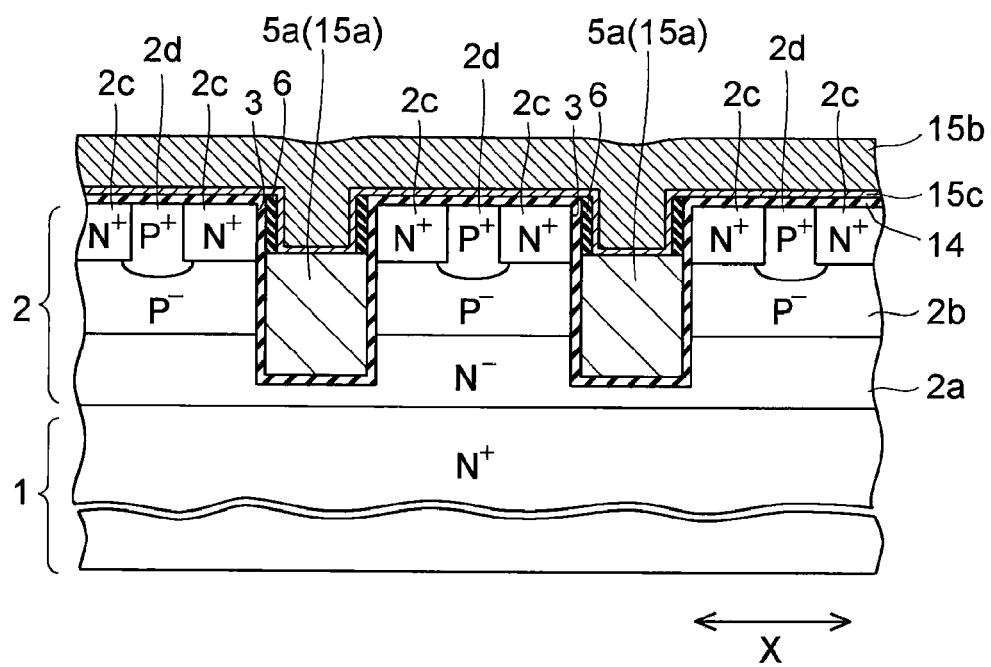
FIG. 12 is a sectional view illustrating a method of manufacturing a MOSFET according to the first embodiment of the invention.

Then, as shown in FIG. 11, by reactive ion etching (RIE) or the like, a predetermined region of the SiN film 16 is removed. In this way, a SiN film 6 is formed on the interior side surfaces of the trenches 3 (the interior side surface of the remaining part thereof where the polysilicon layer 5a is not embedded) with the silicon oxide film 14 interposed. Then, as shown in FIG. 12, a barrier metal layer 15c is formed so as to cover the exposed surfaces of the silicon oxide film 14, the SiN film 6, and the polysilicon layer 5a. The barrier metal layer 15c is formed with a thickness that does not fill the inside of the trenches completely. In this way, a hollow part is secured in an upper part of the trench 3. The depth of the hollow part is, for example, about 0.5 μm.

Figure 13:
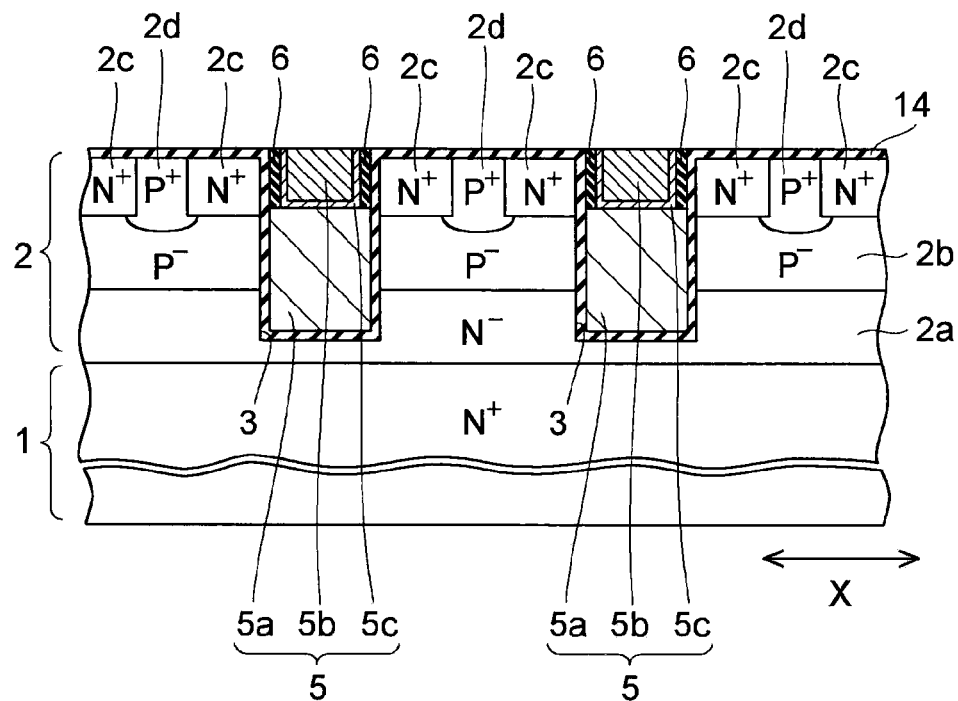
FIG. 13 is a sectional view illustrating a method of manufacturing a MOSFET according to the first embodiment of the invention.

Next, on the upper surface of the barrier metal layer 15c, by sputtering or the like, a low-resistance layer 15b is formed so as to fill the hollow part of the trenches 3. Then, as shown in FIG. 13, by etching back, predetermined regions of the low-resistance layers 15b and the barrier metal layers 15c are removed. In this way, parts of the low-resistance layer 15b and the barrier metal layer 15c outside the trenches 3 are removed, and low-resistance layers 5b and barrier metal layers 5c are formed inside the trenches 3. With the polysilicon layers 5a, the barrier metal layers 5c, and the low-resistance layers 15b inside the trenches 3, gate electrodes 5 are formed.

Figure 14:
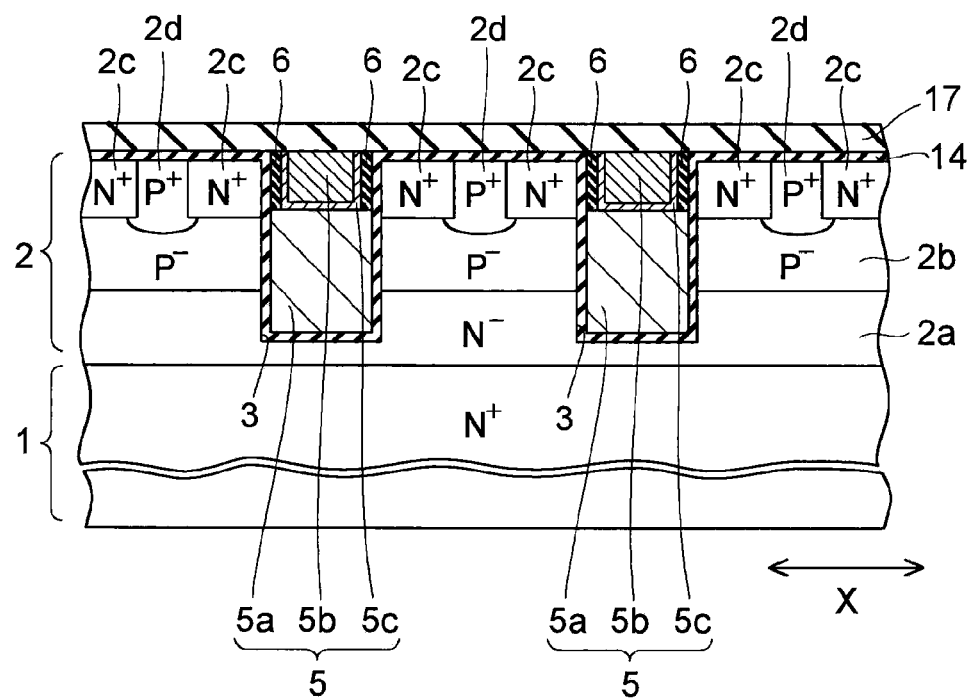
FIG. 14 is a sectional view illustrating a method of manufacturing a MOSFET according to the first embodiment of the invention.
Figure 15:
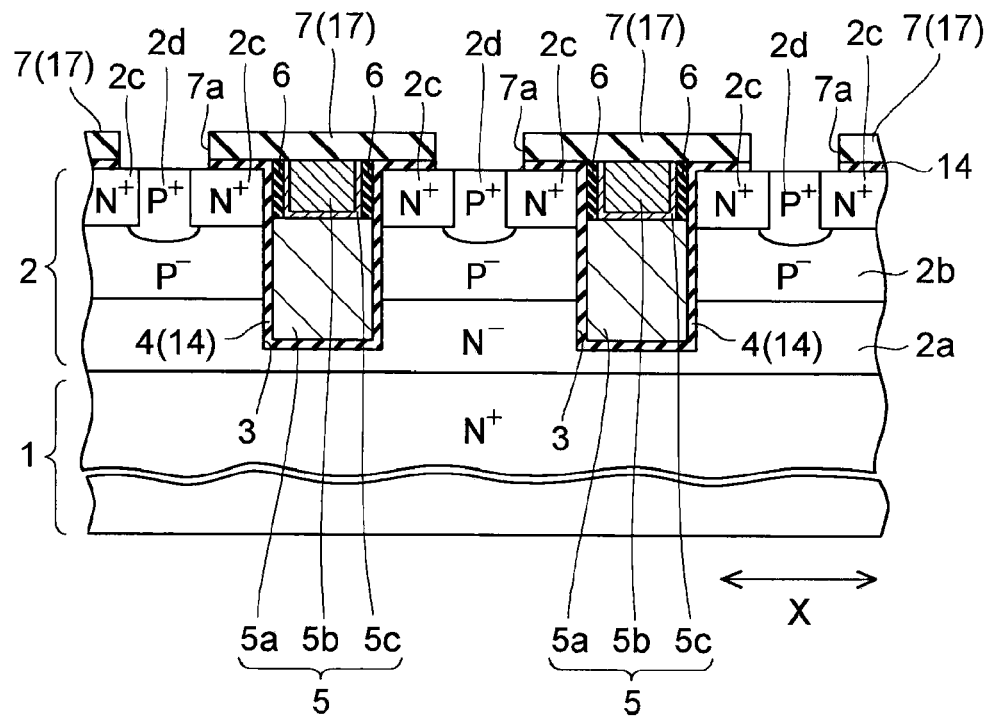
FIG. 15 is a sectional view illustrating a method of manufacturing a MOSFET according to the first embodiment of the invention.

Then, as shown in FIG. 14, on the entire surface of the side, where the epitaxial layer 2 is formed, of the $n^+$-type silicon substrate 1, there is formed an interlayer insulating film 17 made of $SiO_2$. Next, a resist film (unillustrated) having a predetermined opening pattern is formed on the interlaying insulating film 17, and then, using the resist film as a mask, the interlayer insulating film 17 and the silicon oxide film 14 are etched. In this way, contact holes 7a which penetrate the interlayer insulating film 17 and the silicon oxide film 14 are formed, and the $p^+$-type base region 2d and part of the $n^+$-type source region 2c around it are exposed inside the contact holes 7a. This sate is shown in FIG. 15. Note that as a result of the formation of the contact holes 7a, the interlayer insulating film 17 becomes interlayer insulating films 7, and the silicon oxide film 14 becomes silicon oxide films 4.

Figure 16:
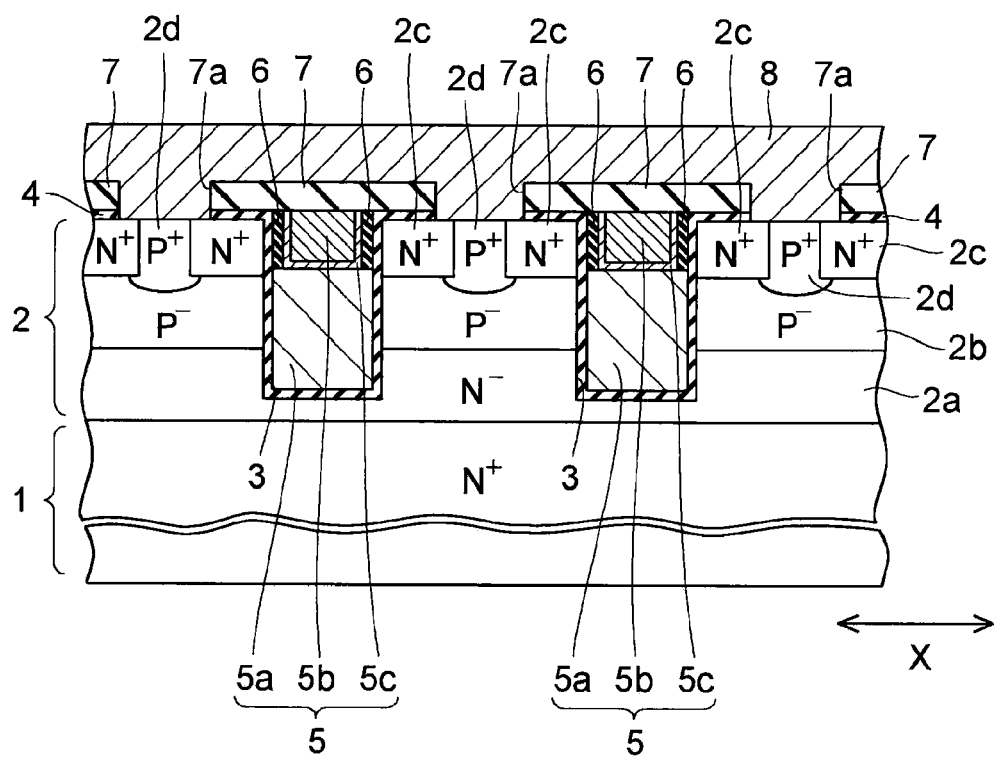
FIG. 16 is a sectional view illustrating a method of manufacturing a MOSFET according to the first embodiment of the invention.

Then, as shown in FIG. 16, by sputtering or the like, a source electrode 8, made of Al, or an alloy of Al and Si, is formed so as to cover the interlayer insulating films 7 and to fill the contact holes 7a. Finally, on the reverse surface of the $n^+$-type silicon substrate 1 (the surface thereof facing away from the epitaxial layer 2), there is formed a drain electrode 9 made out of a multilayer structure including Au, Ti, Ni, Ag, etc. In the manner described above, the MOSFET according to the first embodiment of the invention, shown in FIG. 1, is manufactured.

Second Embodiment

Figure 17:
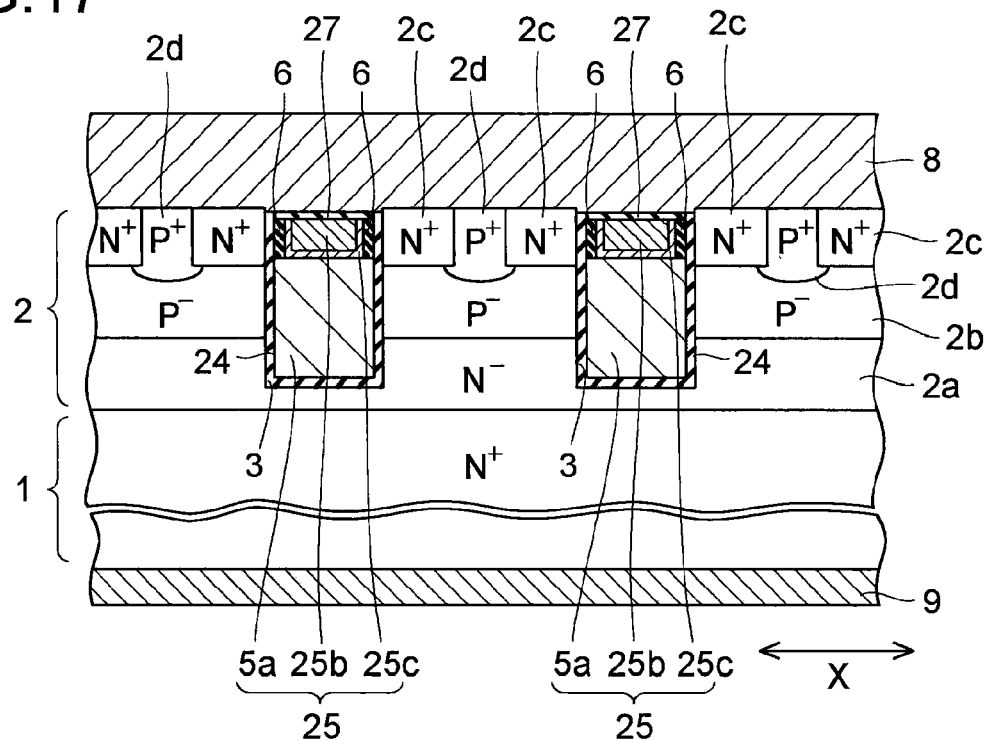
FIG. 17 is a sectional view showing the structure of a MOSFET according to a second embodiment of the invention.
Figure 18:
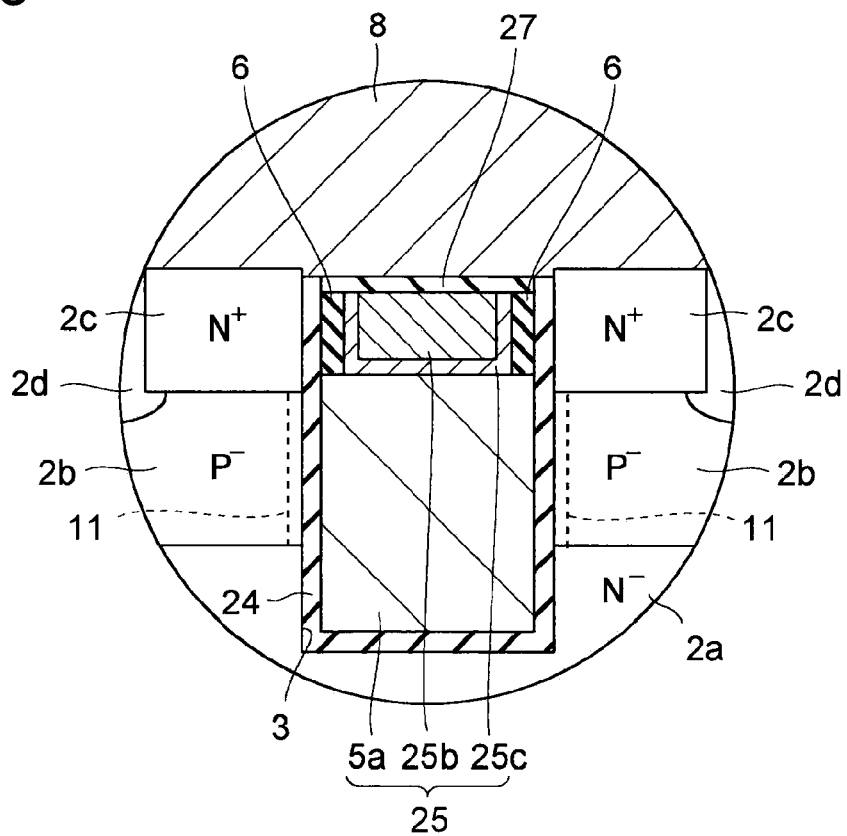
FIG. 18 is an enlarged sectional view showing part of a MOSFET according to the second embodiment.

FIG. 17 is a sectional view showing the structure of a MOSFET according to a second embodiment of the invention. FIG. 18 is an enlarged sectional view showing part of the MOSFET according to the second embodiment. Next, with reference to FIGS. 1, 2, 17, and 18, a description will be given of the structure of the MOSFET according to the second embodiment of the invention.

In the MOSFET according to the second embodiment, as in the above-described first embodiment, a gate electrode 25 includes a polysilicon layer 5a, a low-resistance layer 25b, and a barrier metal layer 25c. The low-resistance layer 25b and the barrier metal layer 25c are made of materials similar to those of the low-resistance layer 5b (see FIGS. 1 and 2) and the barrier metal layer 5c (see FIGS. 1 and 2) in the above-described first embodiment. The low-resistance layer 25b and the barrier metal layer 25c are, compared with in the above-described first embodiment, formed with a smaller thickness in the depth direction of a trench 3. That is, the upper surface of the low-resistance layer 25b and an end part of the barrier metal layer 25c are located below the upper surface of an epitaxial layer 2. Moreover, in the MOSFET according to the second embodiment, an interlayer insulating film 27 is formed inside the trench 3. More specifically, the interlayer insulating film 27 is formed such that its upper surface is located inside the trench 3. Moreover, as distinct from in the above-described first embodiment, a silicon oxide film 24 is not extended to and on the upper surface of the $n^+$-type source region 2c, and it is formed only on the interior side surface of the trench 3. Note that the interlayer insulating film 27 is one example of an "insulating layer" according to the invention.

In the second embodiment, as described above, by forming the interlayer insulating film 27 such that its upper surface is located inside the trench 3, it is possible to make the interval between adjacent trenches smaller, and thus to easily cope with a finer trench pattern.

In other respects, the structure and the effects of the second embodiment are similar to those of the first embodiment.

Figure 19:
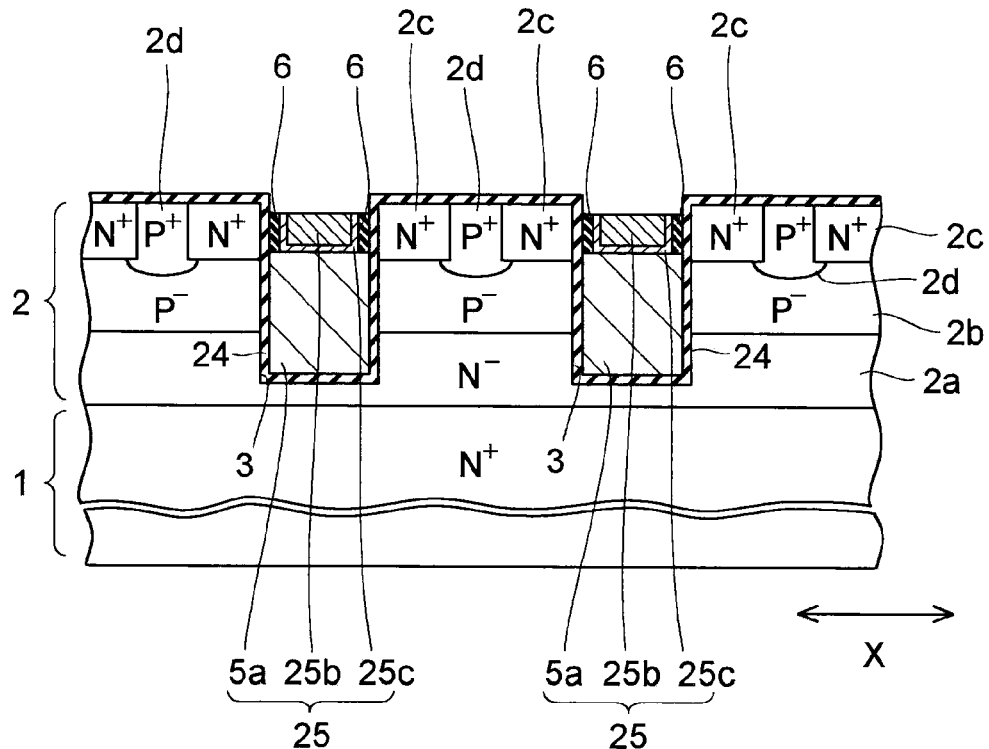
FIG. 19 is a sectional view illustrating a method of manufacturing a MOSFET according to the second embodiment of the invention.
Figure 20:
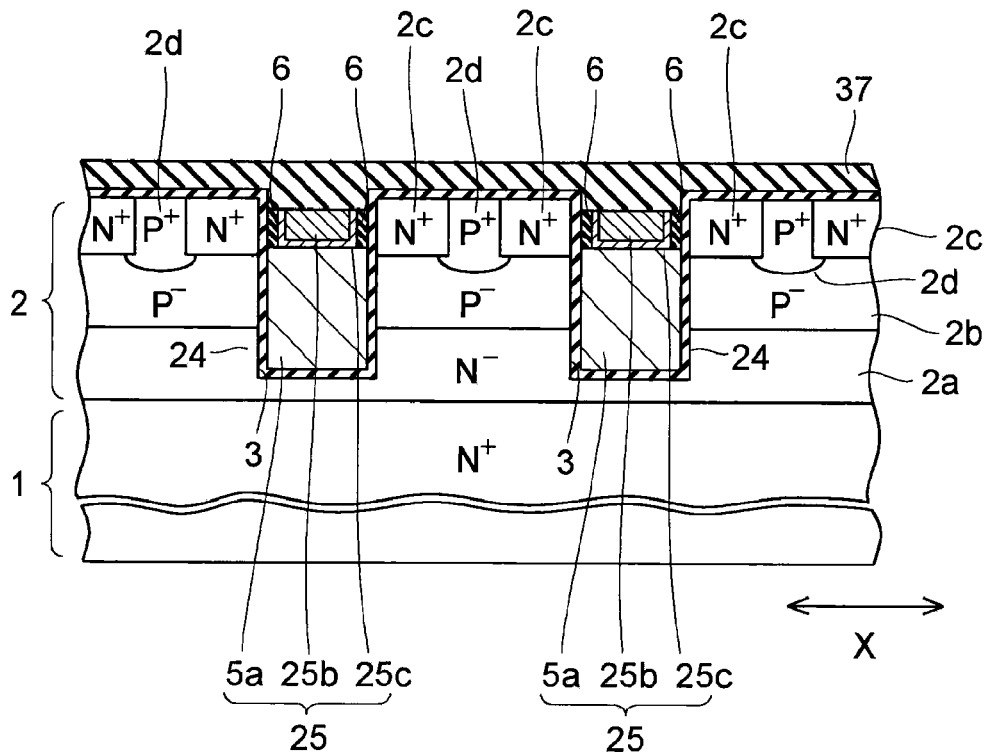
FIG. 20 is a sectional view illustrating a method of manufacturing a MOSFET according to the second embodiment of the invention.
Figure 21:
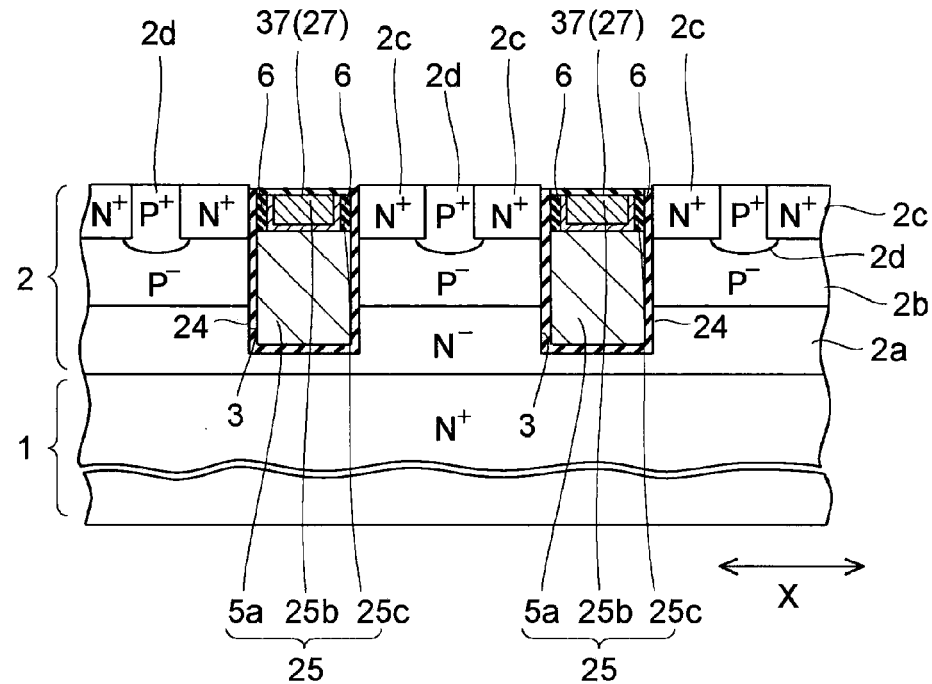
FIG. 21 is a sectional view illustrating a method of manufacturing a MOSFET according to the second embodiment of the invention.
Figure 22:
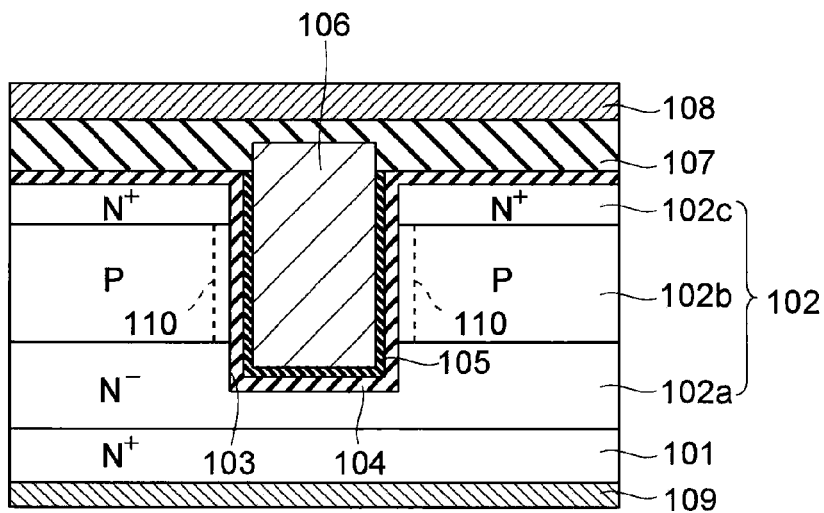
FIG. 22 is a sectional view showing, in a simplified form, the structure of a conventional MOSFET (semiconductor device) disclosed in Japanese Unexamined Patent Application No. 2001-284587.

FIGS. 19 to 21 are sectional views illustrating a method of manufacturing the MOSFET according to the second embodiment of the invention. A description will now be given of the method with reference to FIGS. 4 to 12, 14, 16, 17, and 19 to 21.

First, by a method similar to that in the first embodiment shown in FIGS. 4 to 12, inside the trench 3, a polysilicon layer 5a is formed, and then SiN film 6, a barrier metal layer 15c, and a low-resistance layer 15b are each formed.

Next, by etching back, predetermined regions of the low-resistance layer 5b and the barrier metal layer 15c are removed. Here, the removal of the low-resistance layer 15b and the barrier metal layer 15c includes not only the part of low-resistance layer 15b and the barrier metal layer 15c outside the trench 3, but also part (the shallow part) of the low-resistance layer 15b and the barrier metal layer 15c in the vicinity of the open end of the trench 3. In this way, as shown in FIG. 19, the low-resistance layer 25b and the barrier metal layer 25c are formed inside the trench 3, and inside the trench 3 is formed a shallow hollow part on the low-resistance layer 25b and the barrier metal layer 25c.

Then, by a method similar to that in the first embodiment shown in FIG. 14, on the entire surface of that side of the $n^+$-type silicon substrate 1 on which the epitaxial layer 2 is formed, an interlayer insulating film 37 made of $SiO_2$ is formed. This state is shown in FIG. 20.

Then, by etching back, predetermined regions of the interlayer insulating film 37 and a silicon oxide film 14 are removed. Here, as shown in FIG. 21, the etched-back thickness is controlled such that the etched back surface is located inside the trench 3, that is, such that the silicon oxide film 14 and the interlayer insulating film 37 remain only inside the trench 3. In this way, the interlayer insulating film 27 is formed in the hollow part of the trench 3, with the upper surface (etched back surface) of the interlayer insulating film 27 located below the upper surface of the epitaxial layer 2. Note that by the removal of the silicon oxide film 14 formed on the upper surface of the epitaxial layer 2, the silicon oxide film 24 is formed on the interior side surface of the trench 3.

Subsequently, by a method similar to that in the first embodiment shown in FIG. 16, a source electrode 8 made of Al, or an alloy of Al and Si, is formed on the upper surface of the epitaxial layer 2. Lastly, by a method similar to that in the first embodiment, a drain electrode 9 made out of a multiple structure including any of Au, Ti, Ni, Ag, etc. is formed on the reverse surface of the n⁺-type silicon substrate 1 (the surface thereof facing away from the epitaxial layer 2). In the manner described above, the MOSFET according to the second embodiment of the invention, shown in FIG. 17, is manufactured.

The embodiments disclosed herein are to be considered in all respects as illustrative and not restrictive. The scope of the present invention is set out in the appended claims and not in the description of the embodiments hereinabove, and includes any variations and modifications within the sense and scope equivalent to those of the claims.

For example, although the above-described first and second embodiments deal with an example in which the present invention is applied to a MOSFET as one example of a semiconductor device, this is not meant to limit the invention; it is also possible to apply the invention, instead, to any semiconductor device other than a MOSFET. For example, the invention may be applied to an IGBT (insulated gate bipolar transistor).

Although the above-described first and second embodiments deal with an example in which a p⁻-type doped region, an n⁺-type source region, and a p⁺-type base region are formed before a trench is formed, this is not meant to limit the invention; it is also possible, instead, to form a p⁻-type doped region, an n⁺-type source region, and a p⁺-type base region after a trench is formed.

Although the above-described first and second embodiments deal with an example in which an n-type silicon substrate (semiconductor layer) is used to form a semiconductor device, this is not meant to limit the invention; it is also possible, instead, to form a semiconductor device using a p-type silicon substrate (semiconductor layer). That is, conductivity types may all be reversed.

Although the above-described first and second embodiments deal with an example in which a SiN film is interposed between a low-resistance layer and a silicon oxide film so as to reduce diffusion of constituent atoms of a low-resistance layer into a silicon oxide film (gate insulating film), this is not meant to limit the invention; so long as it is possible to reduce diffusion of constituent atoms of a low-resistance layer into a silicon oxide film, a protecting film made of any material other than SiN may be interposed between a low-resistance layer and a silicon oxide film. For example, an SiO₂ film as a protecting film may be interposed between a low-resistance layer and a silicon oxide film.

Although the above-described first and second embodiments deal with an example in which a plurality of trenches are formed in an epitaxial layer so as to have the shape of stripes in a plan view, this is not meant to limit the invention; it is also possible, instead, to form a trench in any shape other than that of a stripe in an epitaxial layer. For example, a trench may be formed in an epitaxial layer to have the shape of a cross as seen in a plan view.

Although the above-described second embodiment deal with an example in which an interlayer insulating film is formed such that its upper surface is located inside a trench, this is not meant to limit the invention; it is also possible, instead, to form an interlayer insulating film inside a trench such that the upper surface of the former is level with the upper surface of an epitaxial layer.

What is claimed is:

1. A semiconductor device comprising:
   a semiconductor layer including a semiconductor region of one conductivity type;
   a trench formed in the semiconductor layer so as to penetrate through the semiconductor region, the trench having an open end thereof located at a top surface side of the semiconductor layer;
   a channel region formed in the semiconductor region so as to lie along a side wall of the trench; and
   a gate electrode inside the trench with a gate insulating layer interposed between an interior surface of the trench and the gate electrode,
   wherein the gate electrode is embedded inside the trench such that an upper surface of the gate electrode is located above the semiconductor region, the gate electrode including:
      a polysilicon layer disposed so that at least part of the polysilicon layer is at a same depth in the semiconductor layer as the channel region with the gate insulating layer interposed between the gate electrode and the channel region, and
      a low-resistance layer formed on an upper surface of the polysilicon layer and having an electric resistivity lower than an electric resistivity of the polysilicon layer, and
   wherein a protecting film is formed between the gate insulating layer and the gate electrode above the semiconductor region of one conductivity type such that the protecting film does not face the semiconductor region.

2. The semiconductor device according to claim 1, wherein the protecting film is formed so as to cover a side surface of the low-resistance layer.

3. The semiconductor device according to claim 1, wherein the protecting film is made out of a SiN film.

4. The semiconductor device according to claim 1, wherein the low-resistance layer is made out of a metal layer.

5. The semiconductor device according to claim 4, wherein the low-resistance layer contains an element selected from the group of Al, Cu, W, Ti, Mo, Co, Ag, Pt, and Pb.

6. The semiconductor device according to claim 4, wherein the low-resistance layer contains a metal silicide.

7. The semiconductor device according to claim 4, further comprising:
   a barrier metal layer interposed between the polysilicon layer and the low-resistance layer, the barrier metal layer reducing diffusion of metal atoms of the low-resistance layer into the polysilicon layer.

8. The semiconductor device according to claim 1, further comprising:
   an insulating layer formed on an upper surface of the low-resistance layer,
   wherein the insulating layer is formed such that an upper surface of the insulating layer is located inside the trench.

* * * * *